(12) United States Patent
Onodera et al.

(10) Patent No.: US 7,740,790 B2
(45) Date of Patent: Jun. 22, 2010

(54) METHOD OF MAKING LIQUID CRYSTAL POLYMER FILMS

(75) Inventors: Minoru Onodera, Kurashiki (JP);
Tatsuya Sunamoto, Kurashiki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 1381 days.

(21) Appl. No.: 10/947,160

(22) Filed: Sep. 23, 2004

(65) Prior Publication Data

US 2005/0067739 A1    Mar. 31, 2005

(30) Foreign Application Priority Data

Sep. 30, 2003    (JP) .............. 2003-341478

(51) Int. Cl.
*B29C 71/02*    (2006.01)
*B05D 3/02*    (2006.01)

(52) U.S. Cl. ................. 264/345; 427/372.2; 427/385.5; 427/388.1; 427/388.2; 427/384; 264/138; 264/165; 264/230; 156/164; 156/324; 156/308.2; 156/309.9; 156/309.6; 156/272.2

(58) Field of Classification Search .............. 427/372.2, 427/384, 385.5, 388.2, 388.1; 264/345, 138; 264/165, 230; 156/324, 308.2, 164, 309.9, 156/309.6, 272.2; 428/1.6, 1.62, 1.1
See application file for complete search history.

(56) References Cited

U.S. PATENT DOCUMENTS 4,717,624 A * 1/1988 Ikenaga et al. ............ 428/423.1
4,802,061 A  1/1989 Portugall et al.
4,837,268 A  6/1989 Matsumoto et al.
4,851,503 A  7/1989 Matsumoto et al.
4,863,767 A * 9/1989 Garg et al. .................. 428/458

(Continued)

FOREIGN PATENT DOCUMENTS

DE    36 25 263    2/1988

(Continued)

OTHER PUBLICATIONS

Vectra® E130i LCP Materials Data Property sheet (http://tools.ticona.com/tools/mcbasei/product-tools.php?sPolymer=LCP&sProduct=VECTRA), published Feb. 25, 2007.*

(Continued)

*Primary Examiner*—Jason L. Lazorcik
(74) *Attorney, Agent, or Firm*—Oblon, Spivak, McClelland, Maier & Neustadt, L.L.P.

(57) ABSTRACT

A method of making a thermotropic liquid crystal polymer film includes continuously heat treating of the thermotropic liquid crystal polymer film 2 while the latter is jointed to a sheet-like support member 4, and subsequently separating the heat-treated thermotropic liquid crystal polymer film 2 from the support member 4. The continuous heat treatment of the thermotropic liquid crystal polymer film 2 then jointed to the support member 4 is carried out for a predetermined heating time within the range of 5 to 60 seconds at a predetermined heating temperature T° C. equal to or higher than the melting point Tm° C. of the thermotropic liquid crystal polymer film less 15° C. (i.e., Tm−15° C.), but lower than the melting point Tm° C. (thus, Tm−15° C.≦T° C.<Tm° C.), to thereby increase the thermal expansion coefficient of the thermotropic liquid crystal polymer film.

21 Claims, 1 Drawing Sheet

U.S. PATENT DOCUMENTS

| | | | |
|---|---|---|---|
| 4,975,312 A * | 12/1990 | Lusignea et al. | 428/209 |
| 4,983,318 A | 1/1991 | Matsumoto et al. | |
| 5,091,138 A | 2/1992 | Ishii et al. | |
| 5,164,141 A * | 11/1992 | Becker et al. | 264/257 |
| 5,227,115 A * | 7/1993 | Harnischfeger | 264/544 |
| 5,326,848 A | 7/1994 | Kashimura et al. | |
| 5,347,154 A | 9/1994 | Takahashi et al. | |
| 5,360,672 A | 11/1994 | Saito et al. | |
| 5,460,748 A | 10/1995 | Mazaki et al. | |
| 5,529,740 A * | 6/1996 | Jester et al. | 264/317 |
| 5,601,884 A | 2/1997 | Ohnishi et al. | |
| 5,688,436 A | 11/1997 | Ohnishi et al. | |
| 5,693,253 A | 12/1997 | Ohnishi et al. | |
| 5,703,202 A | 12/1997 | Jester et al. | |
| 5,719,354 A | 2/1998 | Jester et al. | |
| 5,730,899 A | 3/1998 | Ohnishi et al. | |
| 5,736,066 A | 4/1998 | Noguchi et al. | |
| 5,753,377 A * | 5/1998 | Takahashi et al. | 428/480 |
| 5,843,562 A | 12/1998 | Onodera et al. | |
| 6,027,771 A | 2/2000 | Moriya | |
| 6,124,004 A * | 9/2000 | Furuta et al. | 428/1.1 |
| 6,274,242 B1 * | 8/2001 | Onodera et al. | 428/411.1 |
| 6,334,922 B1 * | 1/2002 | Tanaka et al. | 156/234 |
| 6,616,796 B1 * | 9/2003 | Onodera et al. | 156/309.6 |
| 6,761,834 B2 * | 7/2004 | St. Lawrence et al. | 252/299.01 |
| 7,052,574 B2 * | 5/2006 | Onodera et al. | 156/309.6 |
| 2002/0170939 A1 | 11/2002 | Onodera et al. | |
| 2008/0107833 A1 | 5/2008 | Onodera et al. | |

FOREIGN PATENT DOCUMENTS

| | | |
|---|---|---|
| EP | 0604838 A1 * | 7/1994 |
| JP | 10-157010 | 6/1998 |

OTHER PUBLICATIONS

Coefficient of Thermal Expansion (http://www.ami.ac.uk/courses/topics/0197_cte/index.html), retrieved Mar. 5, 2008.*

Vectra® A950 product data sheet ( http://tools.ticona.com/tools/mcbasei/product-tools.php?sPolymer=LCP&sProduct=VECTRA) VECTRA® A presents a CTE of-4 ppm/oC—accessed Sep. 3, 2008.*

* cited by examiner

METHOD OF MAKING LIQUID CRYSTAL POLYMER FILMS

BACKGROUND OF THE INVENTION

1. Field of the Invention

The present invention relates to a method of continuously preparing a film made of a thermotropic polymer capable of forming an optically anisotropic melt phase.

In the following description of the present invention, the thermotropic polymer capable of forming an optically anisotropic melt phase is sometimes referred to as a "thermotropic liquid crystal polymer" unless otherwise specified and, also, the film made of such thermotropic liquid crystal polymer will be referred to as a "thermotropic liquid crystal polymer film" unless otherwise specified.

2. Description of the Related Art

The thermotropic liquid crystal polymer film is known to have an excellent low moisture absorbability, a high beat resistance, a high chemical resistance and excellent electrical properties and is therefore rapidly commercialized as an electric insulating material that improves the reliability of printed wiring boards or the like. In recent years, in the field of the electric and electronic appliances, the SMT (surface mounting technology) has come to be widely utilized and is currently largely applied in the production of electric and electronic appliances. As a result, the packaging density of electric and/or electronic component parts on a circuit board has drastically increased and lighter, more compact high-tech products hitherto considered unable to make have come to be developed. Accordingly, the need has arisen to improve the accuracy of dimension of the circuit boards.

When it comes to mounting electric/electronic component parts such as, for example, semiconductor elements and resistance elements directly on a surface of a circuit board, the presence of a difference in coefficient of thermal expansion between the circuit board and the electric/electronic component parts tends to bring about a problem associated with displacement in position of those component parts relative to the electric printed circuit board.

In order to resolve such problem, attempts have made to heat treat a laminated circuit board, made up of a thermotropic liquid crystal polymer film and a metallic foil, prior to electric/electronic component parts being mounted on the surface thereof, so as to render the film, forming a part of the laminated circuit board, to have a thermal expansion coefficient to be substantially equal to that of the electric/electronic component parts, such as disclosed in, for example, the Japanese Laid-open Patent Publication No. 10-157010. Also, U.S. Pat. No. 5,529,740, issued Jun. 25, 1996, to Jester, et al., for example, discloses the heat treatment of a laminated product, including the thermotropic liquid crystal polymer film and a support body made up of the metal foil, to thereby improve the physical properties of the thermotropic liquid crystal polymer film.

According to the Japanese laid-open patent publication referred to above, it is described that if the thermotropic liquid crystal polymer film forming apart of the laminated circuit board has a thermal expansion coefficient larger than that of a component part to be surface mounted, the heat treatment of the laminated circuit board is carried out at a temperature within the range of the temperature, which is lower by 140° C. than the melting point of the film, to the melting point thereof and that by so doing, the thermal expansion coefficient of the film could be lowered by $18 \times 10^{-6}$ cm/cm/° C. at the maximum. It is also described that if the film has a thermal expansion coefficient smaller than that of a component part to be surface mounted, the heat treatment of the laminated circuit board is carried out at a temperature within the range of, the melting point of the film to the temperature, which is higher by 20° C. than the melting point thereof, to thereby render the film to have an increased thermal expansion coefficient.

On the other hand, the USP referred to hereinabove discloses heating of a thermotropic liquid crystal polymer film, held in contact with a support body, at a temperature higher than the melting point of the film to thereby melt the latter and subsequent cooling of the melted film to form of a solidified polymer layer. This USP also discloses various physical properties of the resultant film and describes that the thermal expansion coefficient of the film could have been increased by means of the heating and cooling carried out in the specified manner.

However, as is well known to those skilled in the art, the thermotropic liquid crystal polymer, when formed a film by the use of an extrusion molding technique such as, for example, an inflation molding, generally results in the film having a negative coefficient of thermal expansion. When it comes to the use of such thermotropic liquid crystal polymer film as an electric insulating layer on the circuit board, in order for the thermotropic liquid crystal polymer film to have a thermal expansion coefficient matching with that of component parts to be eventually surface mounted on the printed circuit board, the thermal expansion coefficient of the thermotropic liquid crystal polymer film must be increased during the course of manufacture of the circuit board. Although as hereinabove discussed, the thermal expansion coefficient of the thermotropic liquid crystal polymer film can be adjusted by means of the specific heat treatment, it is generally understood that to increase the thermal expansion coefficient of the thermotropic liquid crystal polymer film the heat treatment must be carried out at a temperature equal to or higher than the melting point thereof as disclosed in any one of the previously discussed patent literatures.

It has, however, been found that the heat treatment of the thermotropic liquid crystal polymer film at such a high temperature involves numerous problems associated with the manufacture thereof on an industrial scale. Specifically, as a result of excessive thermal load imposed on the film, the resin tends to be quickly deteriorated; the higher the temperature of heat treatment, the more difficult to control the thermal expansion coefficient of the film precisely; inconveniences such as, for example, film deflection tend to occur easily; a substantial amount of energies is required to accomplish the intended heat treatment; and apparatuses used to manufacture the thermotropic liquid crystal polymer films are limited to result in increase of costs.

SUMMARY OF THE INVENTION

In view of the foregoing, the present invention has for its object to provide an improved method of manufacturing a thermotropic liquid crystal polymer film on an industrially advantageous manner, which film is has a controlled coefficient of thermal expansion and is useful as an electric insulating material for use with a circuit board such as, for example, a flexible circuit board or a multilayered circuit board.

In order to resolve the various problems hitherto encountered in connection with the manufacture of the thermotropic liquid crystal polymer film, the inventors of the present invention have conducted a series of research and experiments and, as a result thereof, have acquired the following findings.

Specifically, it has hitherto generally been considered that the heat treatment of the thermotropic liquid crystal polymer film at a temperature lower than the melting point thereof results in reduction of the thermal expansion coefficient of the film, but the heat treatment of the thermotropic liquid crystal polymer film at a temperature higher than the melting point thereof results in increase of the thermal expansion coefficient of the film. However, the inventors of the present invention have found the phenomenon, in which if the heat treatment is carried out under a specific manufacturing condition, even the heat treatment of the thermotropic liquid crystal polymer film at a temperature lower than the melting point thereof results in increase of the thermal expansion coefficient thereof. The inventors of the present invention have also found that the heat treatment of the thermotropic liquid crystal polymer film at a temperature lower than the melting point thereof under the specific manufacturing condition could, even though it is carried out for a short period of time, result in increase of the thermal expansion coefficient thereof. Based on those findings in combination with results of further studies conducted subsequently, the inventors of the present invention have successfully reached the present invention.

In order to accomplish the foregoing and other objects and features of the present invention, the present invention herein disclosed provides a method of making a thermotropic liquid crystal polymer film, which includes continuously heat treating the thermotropic liquid crystal polymer film while the latter is jointed to a sheet-like support member and subsequently separating the heat-treated thermotropic liquid crystal polymer film from the support member. The continuous heat treatment of the thermotropic liquid crystal polymer film then jointed to the support member is carried out for a heating time within the range of 5 to 60 seconds at a heating temperature T° C. equal to or higher than the melting point Tm° C. of the thermotropic liquid crystal polymer film less 15° C. (i.e., Tm−15° C.), but lower than the melting point Tm° C. (thus, Tm−15° C.≦T° C.<Tm° C.). By so doing, the thermal expansion coefficient of the thermotropic liquid crystal polymer film can be increased to a value higher than that of the same thermotropic liquid crystal polymer film before the heat treatment. The heating temperature T referred to above is preferably equal to higher than the melting point Tm less 10° C., but lower than the melting point Tm° C. (thus, Tm−10° C.≦T° C.<Tm° C.) and, more preferably equal to or higher than the melting point Tm° C. less 6° C., but lower than the melting point Tm° C. (thus, Tm−6° C.≦T° C.<Tm° C.).

If the heating temperature T° C. is lower than the lowermost limit of (Tm−15° C.), the coefficient of thermal expansion of the thermotropic liquid crystal polymer film does not increase, but if heating temperature T° C. is equal to or higher than the melting point Tm° C., the coefficient of thermal expansion of the thermotropic liquid crystal polymer film abruptly increases to such an extent as to be no longer controlled and, also, the resultant thermotropic liquid crystal polymer film will be easily and quickly deteriorated.

The support member referred to above may preferably be used in the form of a sheet-like member having a coefficient of thermal expansion higher than that of the thermotropic liquid crystal polymer film.

Although the heating time required to heat treat the thermotropic liquid crystal polymer film varies depending on the heating temperature, the thickness of the support member and the thickness of the thermotropic liquid crystal polymer film, the heating time within the range of 5 to 60 seconds is satisfactory, but preferably within the range of 10 to 30 seconds. If the heating time is shorter than 5 seconds, the thermal expansion coefficient of the thermotropic liquid crystal polymer will not increase, but if it is conversely longer than 60 seconds, the productivity of the film will be lowered with industrial advantages lost consequently.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims.

The sole accompanying drawing.

DETAILED DESCRIPTION OF THE EMBODIMENTS

Figure 1:
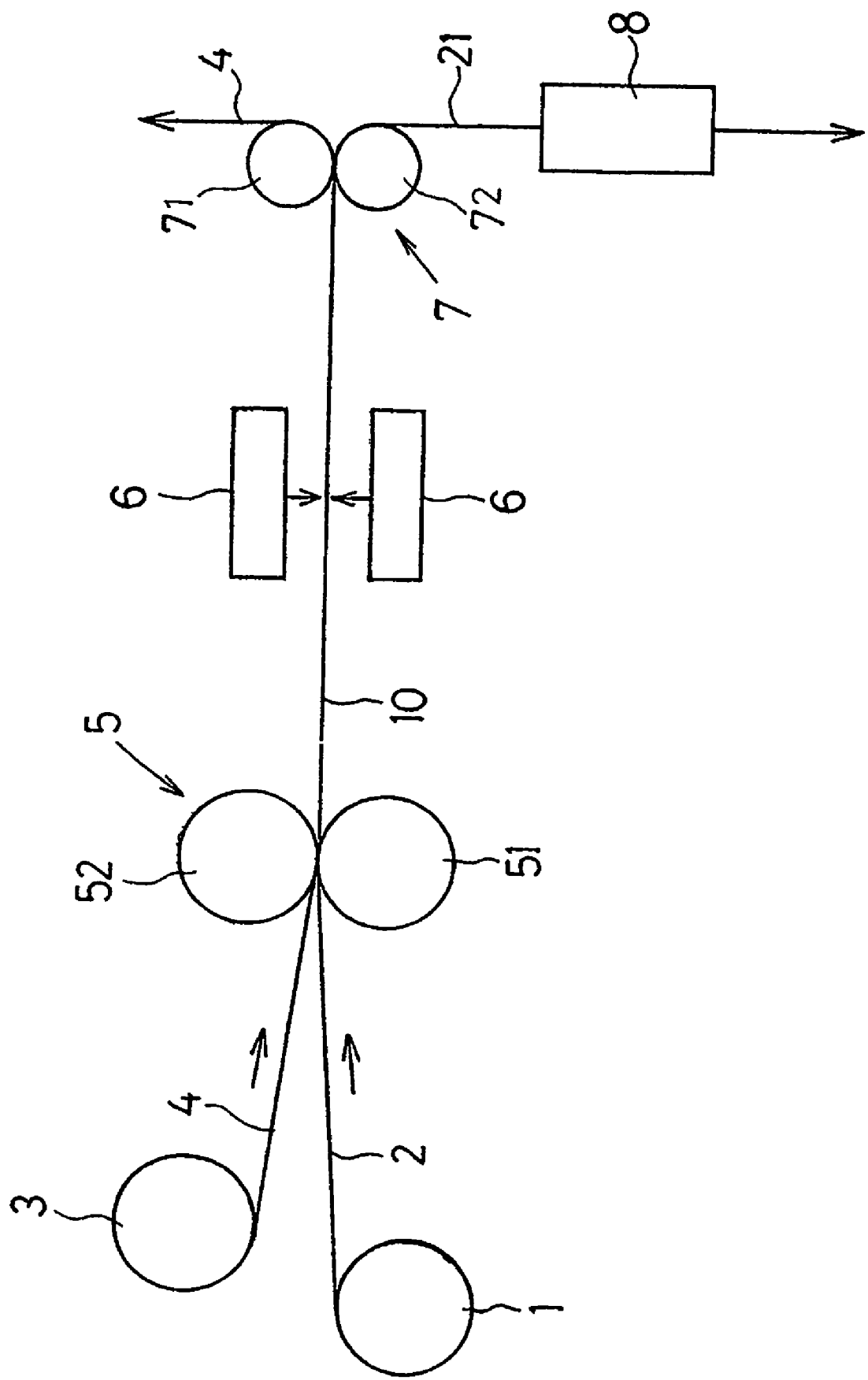
FIG. 1, is a schematic side view of an apparatus for continuously making a thermotropic liquid crystal polymer film according to a film making method of the present invention.

Specific examples of thermotropic liquid crystal polymer films that can be employed in the practice of the present invention include, although not specifically limited thereto, well known thermotropic liquid crystal polyester and thermotropic liquid crystal polyester amide prepared from such compounds as classified under (1) to (4) below, and their derivatives.

(1) Aromatic or aliphatic dihydroxy compounds, representative examples of which are shown in Table 1 below.

TABLE 1

Chemical formulas of the representative examples of aromatic or aliphatic dihydroxy compounds HO—C₆H₃(X)—OH (X: hydrogen atom or halogen atom, or lower alky, phenyl or like groups)

HO—naphthalene—OH

HO—C₆H₄—C₆H₄—OH

HO—C₆H₄—Y—C₆H₄—OH (Y: —O—, —CH₂—, —S— or like groups)

anthraquinone dihydroxy compound; HO—C₆H₄—OH (meta)

HO(CH₂)nOH (n: an integer from 2 to 12)

(2) Aromatic or aliphatic dicarboxylic acids, representative examples of which are shown in Table 2 below.

TABLE 2

Chemical formulas of the representative examples of aromatic or aliphatic dicarboxylic acids

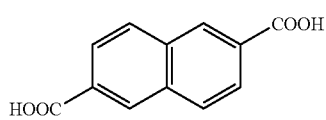

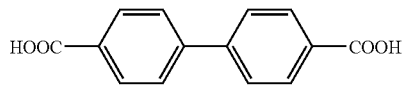

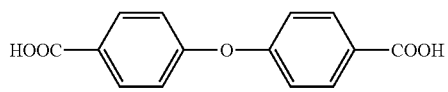

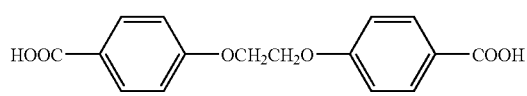

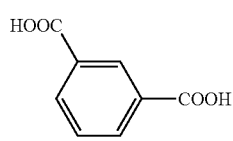

HOOC (CH$_2$)nCOOH  (n: an integer from 2 to 12)

(3) Aromatic hydroxycarboxylic acids, representative examples of which are shown in Table 3 below.

TABLE 3

Chemical formulas of the representative examples of aromatic hydroxycarboxylic acids

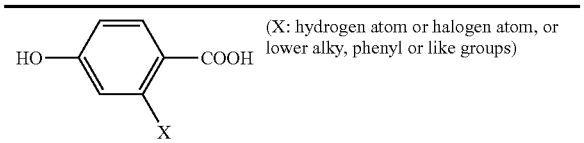

(X: hydrogen atom or halogen atom, or lower alky, phenyl or like groups)

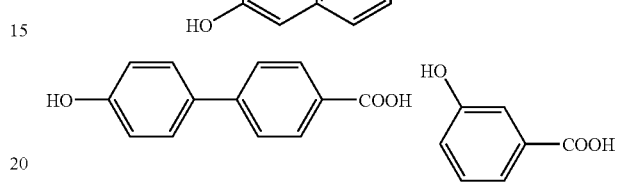

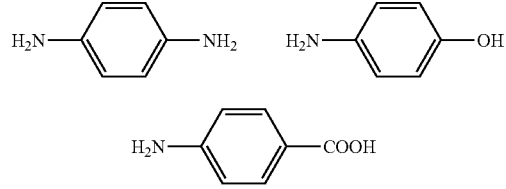

(4) Aromatic diamines, aromatic hydroxyamines and aromatic aminocarboxylic acids, representative examples of which are shown in Table 4 below.

TABLE 4

Chemical formulas of representative examples of aromatic diamines, aromatic hydroxyamines and aromatic aminocarboxylic acids

H$_2$N—⟨⟩—NH$_2$    H$_2$N—⟨⟩—OH

H$_2$N—⟨⟩—COOH

Representative examples of the liquid crystal polymers prepared from any of those starting compounds include copolymers having such structural units as indicated by (a) to (e) in Table 5 below.

TABLE 5

Structural units of the representative examples of thermotropic liquid crystal polymers (a) 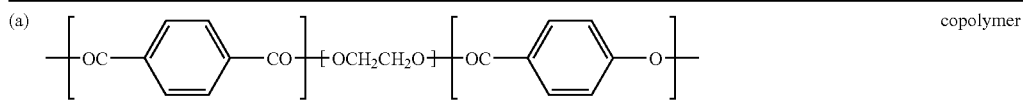 copolymer (b) 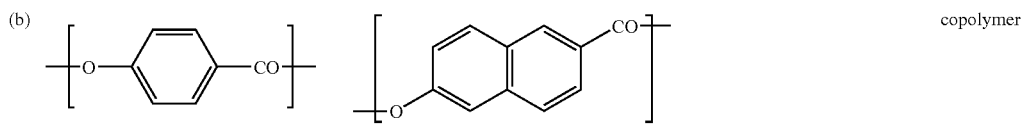 copolymer (c) 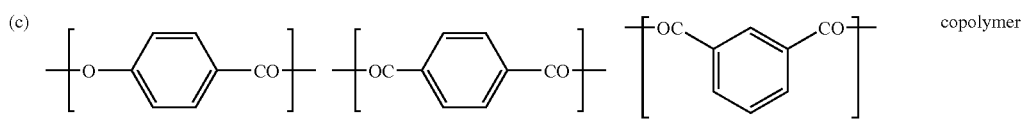 copolymer

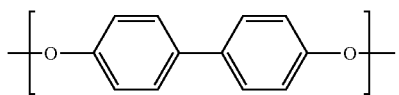

TABLE 5-continued

Structural units of the representative examples of thermotropic liquid crystal polymers

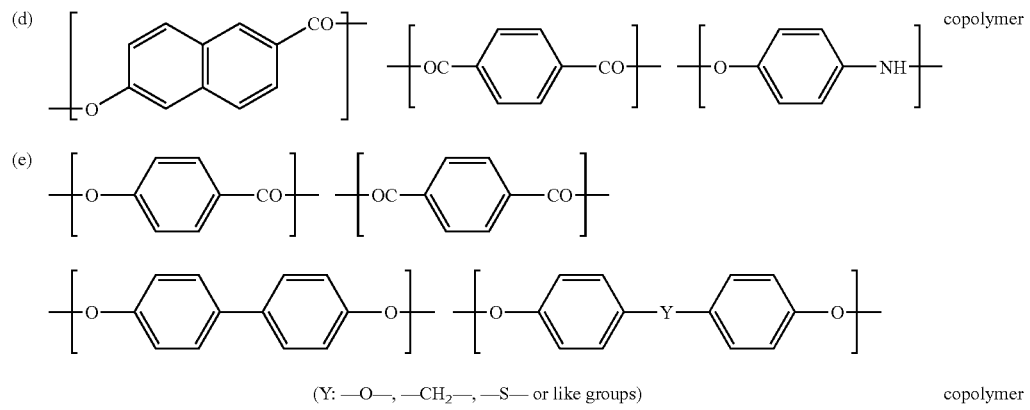

(Y: —O—, —CH$_2$—, —S— or like groups)

Those thermotropic liquid crystal polymers that can be employed in the practice of the present invention have a melting point preferably within the range of from about 200 to about 400° C. and, more preferably, within the range of from about 250 to about 350° C., so that the resultant film can have a desirable heat resistance and a desirable processability.

The thermotropic liquid crystal polymer film that can be employed in the practice of the present invention can be obtained by means of an extrusion molding. Although any known extrusion molding method can be employed, the T-die film forming and stretching method, the lamination and stretching method, the inflation method, and others well known to those skilled in the art can also be employed. Particularly with the lamination and stretching method or the inflation method, stresses can be applied not only in a direction of the mechanical axis (longitudinal direction) of the film (which direction is hereinafter referred to as the MD direction), but also in a direction perpendicular to the MD direction (which direction is hereinafter referred to as the TD direction) and, therefore, the lamination and stretching method or the inflation method is effective to eventually manufacture the thermotropic liquid crystal polymer film having balanced mechanical and thermal properties in both of the MD and TD directions.

The thickness of the thermotropic liquid crystal polymer film is not particularly limited. A sheet-like or plate-like film of not more than 2 mm can be also used. However, for the purpose of the present invention, the thickness of the film is preferably within the range of 20 to 150 μm and, more preferably, within the range of 20 to 50 μm. In addition, the thermotropic liquid crystal polymer film used in the practice of the present invention may contain one or a mixture of various additives such as a lubricant, filler and/or an antioxidant added thereto.

In the present invention, the support member utilized during the heat treatment is preferably of a kind having a coefficient of thermal expansion higher than that of the thermotropic liquid crystal polymer film before the latter is heat treated. Aluminum, copper, stainless steel, polytetrafluoroethylene, titan, iron, chromium steel or nickel may be used as a material for the support member, but aluminum, stainless steel, titan or nickel is a preferred material as it has an excellent anticorrosive resistance and a durability. The support member may be surface treated by means of any known chemical surface treating method such as, for example, acid cleaning, which is currently applied to any standard metal, unless it does not adversely affect the function and effects of the present invention. Also, the sheet-like support member has a thickness preferably within the range of 7 to 200 μm and, more preferably, within the range of 7 to 75 μm.

In the practice of the present invention, it is necessary for the support member to be jointed to at least one of opposite surfaces of the thermotropic liquid crystal polymer film during the heat treatment. However, the support member may alternatively be jointed to each of the opposite surfaces of the thermotropic liquid crystal polymer film during the heat treatment.

Jointing of the thermotropic liquid crystal polymer film to the support member can be accomplished by the use of any known means such as a hot press bonding technique. When the thermotropic liquid crystal polymer film and the support member are to be jointed together, such jointing is preferably carried out continuously by the use of any known apparatus such as, for example, a hot roll press or a double belt press.

The jointed assembly including the thermotropic liquid crystal polymer film jointed to the support member may, after it has been wound around a tape-up roll, be transferred to a heat treatment station at which the heat treatment is carried out in accordance with the present invention. However, in terms of the productivity being increased, the jointing of the support member with the thermotropic liquid crystal polymer film is preferably followed immediately by the heat treatment in accordance with the present invention.

Referring now to the accompanying drawing, FIG. 1 schematically illustrates an apparatus for continuously making a thermotropic liquid crystal polymer film according to a film making method of the present invention. The film making apparatus shown therein includes a film supply roll 1 from which a length of the thermotropic liquid crystal polymer film 2 is drawn outwardly, and a support supply roll 3 from which a length of the sheet-like support member 4 is drawn outwardly. The length of the thermotropic liquid crystal polymer film 2 from the film supply roll 1 and the length of the support member 4 from the support supply roll 3 are continuously supplied so as to overlap one above the other and, as they pass through a hot press roll assembly 5, are jointed together in a manner described in detail later to provide a laminate 10, which is in turn supplied towards a heating unit 6. The laminate 10 having been heat treated by the heating unit 6 is subsequently supplied to a separating roll assembly 7 including upper and lower rolls to separate the length of the heat-treated thermotropic liquid crystal polymer film and the support member 4 from each other. The thermotropic liquid crystal polymer film having been so heat treated and subsequently separated from the support member 4, identified by 21, has a coefficient of thermal expansion having been increased as a result of the heat treatment to a value higher than that of the thermotropic liquid crystal polymer film prior to being heat treated.

In the illustrated embodiment, the hot press roll assembly 5 referred to above includes, for example, a heat resistant rubber roll 51 and a metal roll 52 positioned one above the other with a nipping area defined therebetween to apply a hot press bonding to the jointed assembly. Preferably, the jointed assembly is passed through the nipping area with the thermotropic liquid crystal polymer film 2 and the support member 4 held in contact with the heat resistant rubber roll 51 and the metal roll 52, respectively. Also, in the illustrated embodiment, a post-heating unit 8 is employed and positioned at a location downstream of the separating roll assembly 7 and only along the path of travel of the heat-treated thermotropic liquid crystal polymer film 21, so that the latter can be additionally heated to remove internal strains built up therein.

The heat resistant rubber roll 51, which can be suitably employed in the practice of the present invention, is of a type having a roll surface of a hardness equal to or larger than 80 degrees and, preferably, within the range of 80 to 95 degrees as measured by the use of an A-type spring hardness testing machine based on JIS K 6301. A rubber material having a hardness of 80 degree or more can be obtained by adding a vulcanizer and a vulcanization accelerator such as an alkaline substance into a synthetic rubber material such as, for example, silicone rubber and fluororubber, or a natural rubber. If the hardness of the roller surface is lower than 80 degrees, an insufficient pressure will be applied to the jointed assembly during the hot press bonding to such an extent as to result in an insufficient bonding strength exhibited after the jointing and, also, an undesirable delamination and/or swelling occurring during the heat treatment. On the other hand, if the hardness of the roller surface exceeds 95 degrees, a localized pressure will develop between the metal roll 52 and the heat resistant rubber roll 51 to such an extent as to result in detects in shape, such as deflection and/or crinkling of the thermotropic liquid polymer film.

The pressure applied to the thermotropic liquid crystal polymer film 2 and the support member 4, then forming the jointed assembly, through the hot press roll assembly 5 is preferably equal to or higher than 20 Kg/cm$^2$, as calculated in terms of the surface pressure, where a combination of the heat resistant rubber roll 51 and the metal roll 52 such as shown is employed, but is preferably equal to or higher than 5 Kg/cm, as calculated in terms of the linear pressure, where a combination of rolls, which do not substantially results in deflection at the nipping area between those rolls. Where the pressure applied to the thermotropic liquid crystal polymer film 2 and the support member 4 is higher than the above specified value, an adhesion force sufficient to allow the delamination and/or swelling not to occur in the thermotropic liquid polymer film 2 being heat treated can be exerted with concomitant suppression of formation of uneven adhesion force.

The uppermost limit of the pressure to be applied to the thermotropic liquid crystal polymer film 2 and the support member 4 is not specifically limited to a particular value. However, in order that the thermotropic liquid crystal polymer film 2 and the support member 4 can be jointed together without the film being allowed to flow and extrude from the support member 4 during the hot press bonding and, also, the heat-treated thermotropic liquid crystal film 2 can easily be separated from the support member 4 after the heat treatment, the pressure not exceeding 400 Kg/cm as calculated in terms of the linear pressure or 200 Kg/cm$^2$ as calculated in terms of the surface pressure is preferred for the uppermost limit. It is to be noted that if the temperature of the hot press roll assembly 5 is low, the thermotropic liquid crystal polymer film 2 being thermally press-bonded will not be susceptible to flow and extrude relative to the support member 4 even though the pressure being then applied exceeds the uppermost limit referred to above.

It is also to be noted that the linear pressure of the hot press roll assembly 5 referred to above is represented by the force (pressing load) applied to the hot press roll assembly 5 divided by the effective width of the hot press roll assembly 5 and that the surface pressure referred to above is represented by the pressing load divided by the area of the pressure applying surface defined by deflection of the hot press roll assembly 5 during the hot press bonding.

In order to allow the thermotropic liquid crystal polymer film 2 to have a good appearance and, also, to allow an adhesion force, which is sufficient to avoid the delamination and/or swelling occurring in the thermotropic liquid polymer film 2 being heat treated, to be exerted during the heat treatment, the support member 4 and the thermotropic liquid crystal polymer film 2 are preferably thermally press-bonded together at a temperature ranging from a value equal to the melting point Tm° C. thereof less 50° C. (i.e., Tm−50° C.) to a value equal to the melting point Tm° C. thereof less 5° C. (i.e., Tm−5° C.). When this hot press bonding is carried out, the support member 4 is preferably preheated to lessen an abrupt thermal expansion thereof which would occur when the support member 4 is brought directly into contact with the hot press roll assembly 5.

By so doing, deflection of the thermotropic liquid crystal polymer film 2, which would occur when it is brought into contact with the hot press roll, can advantageously be minimized and, also even when the tension of the thermotropic liquid crystal polymer film 2 being drawn outwardly from the film supply roll 1 is increased, an undesirable change in appearance can advantageously be minimized. During the preheating of the support member 4, the thermotropic liquid crystal polymer film 2 and the support member 4 are preferably drawn outwardly from the supply rolls 1 and 3, respectively, at a transport speed of 10 m/min, in order to facilitate a heat transmission thereto. The temperature at which the support member 4 is preheated varies depending on the material for the support member 4, the thermal expansion coefficient thereof and/or the thickness thereof, but, for example, it may preferably within the range of 150 to 200° C. in the case where the support member 4 is made of stainless steel and having a size of 50 μm in thickness and 600 mm in width.

In the practice of the present invention, when the thermotropic liquid crystal polymer film 2 and the support member 4 are passed through the nipping area of the hot press roll assembly 5 to be thermally press-bonded them together, the rolls 51 and 52 of the hot press roll assembly 5 are preferably driven at a speed equal to or lower than 10 m/min as calculated in terms of linear velocity of the periphery thereof. Although the lowermost limit of the speed of the roll is not specifically limited to a particular value, the speed is desirably not lower than 0.1 m/min from the standpoint of industrial purposes since too low speed may result in lowering of the production efficiency.

The heating unit 6 utilized to heat treat the laminate 10, i.e., the jointed assembly of the thermotropic liquid crystal polymer film 2 with the support member 4 after the passage past the hot press roll assembly 5, may be in the form of any known heating means such as, for example, a dry oven, a hot roll assembly or a ceramic heater.

When the laminate 10 is to be heat treated by the heating unit 6, it is necessary to perform the heat treatment at a heating temperature T° C. equal to or higher than the melting point Tm of the thermotropic liquid crystal polymer film less 15° C. (i.e., Tm−15° C.), but lower than the melting point Tm° C. (thus, Tm−15° C.≦T° C.<Tm° C.). The heat treatment carried out continuously under such temperature condition, even though performed at a temperature lower than the melting point of the thermotropic liquid crystal polymer film, is effective to increase the thermal expansion coefficient of the thermotropic liquid crystal polymer film to a value higher than that of the same thermotropic liquid crystal polymer film before the heat treatment, even though. Hence, the good thermotropic liquid crystal polymer film having a controlled thermal expansion coefficient can be obtained.

Where the heating temperature T° C. is lower than the lowermost limit of (Tm−15° C.), the coefficient of thermal expansion of the thermotropic liquid crystal polymer film does not increase, but if heating temperature T° C. is equal to or higher than the melting point Tm° C., the coefficient of thermal expansion of the thermotropic liquid crystal polymer film abruptly increases to such an extent as to be no longer controlled and, also, the resultant thermotropic liquid crystal polymer film will be easily and quickly deteriorated.

The heating time, over which the laminate 10, particularly the thermotropic liquid crystal polymer film 2 is heat treated by the heating unit 6, varies depending on the heating temperature, the thickness of the support member and the thickness of the thermotropic liquid crystal polymer film, but the heating time is preferably within the range of 5 to 60 seconds and, more preferably within the range of 10 to 30 seconds.

Also in the practice of the present invention, when the thermotropic liquid crystal polymer film 2 and the support member 4 are continuously heat treated by the heating unit 6, the heat treatment is carried in a condition with the thermotropic liquid crystal polymer film 2 receiving stresses from the support member 4. In such case, even though the heat treatment is carried out at the temperature lower than the melting point Tm, the thermal expansion coefficient of the thermotropic liquid crystal polymer film can advantageously be increased and this is surprisingly in contrast to the prior findings that have provided the basis for the prior art heat treatment.

More specifically, the prior findings that the thermal expansion coefficient of the thermotropic liquid crystal polymer film would decrease when the heat treatment is carried out at the temperature lower than the melting point Tm of the thermotropic liquid crystal polymer film are all observed where the heat treatment is carried out on a batch system, not a continuous system. However, the inventors of the present invention have found for the first time that if the heat treatment is continuously carried out to the thermotropic liquid crystal polymer film jointed to the support member, that is, laminate 10, proper selection of heat treating conditions is effective for the thermotropic liquid crystal polymer film to have an increased thermal expansion coefficient even though the heat treatment is carried out at a temperature lower than the melting point Tm thereof.

When the heat treatment is carried out by the heating unit 6 while the thermotropic liquid crystal polymer film 2 and the support member 4 are jointed together, it is preferred to apply a tension to the laminate 10 from the hot press rolls and separating rolls. The higher the tension applied to the laminate 10, the more the heating temperature can be lowered.

The heat treatment performed by the use of the heating unit 6 as hereinabove described has to be terminated when the thermal expansion coefficient of the thermotropic liquid crystal polymer film attains a desired value. At this moment, the thermotropic liquid crystal polymer film 21 after the heat treatment and the support member 4 preferably have their thermal expansion coefficients CTEf and S, respectively, which satisfy such a relation as shown by the following formula;

$$-30 \times 10^{-6} \leq CTEf - S \leq 10 \times 10^{-6} \ (cm/cm/°C.)$$

If the difference between the thermal expansion coefficient CTEf of the thermotropic liquid crystal polymer film 21 after the heat treatment and the thermal expansion coefficient S of the support member 4 satisfies the above relation and, hence, falls within the range discussed above, the thermotropic liquid crystal polymer film 21 would be useful as an electric insulating material conveniently utilized in circuit boards or the like. More preferably, the difference (CTEf−S) between the thermal expansion coefficient CTEf of the thermotropic liquid crystal polymer film 21 after the heat treatment and the thermal expansion coefficient S of the support member 4 satisfies the following relation:

$$-20 \times 10^{-6} \leq CTEf - S \leq 5 \times 10^{-6} \ (cm/cm/°C.)$$

In particular, the thermal expansion coefficient CTEf of the thermotropic liquid crystal polymer film 21 is preferably within the range of $0 \times 10^{-6}$ to $30 \times 10^{-6}$ (cm/cm/° C.) and, more preferably, within the range of $0 \times 10^{-6}$ to $20 \times 10^{-6}$ (cm/cm/° C.). If the thermal expansion coefficient CTEf is within this range, the thermotropic liquid crystal polymer film 21 so obtained can be used as an electric insulating material conveniently utilized in flexible circuit substrates and multilayered circuit substrates.

The atmosphere under which the heat treatment is carried out by the heating unit 6 may be suitably selected depending on the material for the thermotropic liquid crystal polymer film 2 used and that for the support member 4, but the atmosphere filled with an inert gas is preferred. The inert gas atmosphere is intended to the atmosphere filled with an inert gas such as, for example, carbon dioxide, nitrogen or argon, or reduced in pressure and containing an activated gas such as, for example, an oxygen in a quantity not greater than 1.0 vol. %. In particular, the amount of the activated gas in the inert gas atmosphere is preferably not greater than 0.1 vol. %.

When the thermotropic liquid crystal polymer film 2 is to be separated from the support member 4, any suitable separating method can conveniently be employed. However, a separating method is preferred, in which using the separating roll assembly 7 including the rolls 71 and 72 as shown in FIG. 1, the thermotropic liquid crystal polymer film 2 and the support member 4 are peeled off from each other in respective directions opposite to each other as they emerge outwardly from a nipping area between the rolls of the separating roll assembly 7. Alternatively, only the support member 4 may be chemically dissolved with the use of, for example, an etchant, thereby leaving the thermotropic liquid crystal polymer film 21 having an increased thermal expansion coefficient.

It is to be noted that the separating process described as performed by the use of the separating roll assembly 7 may not be always essential in the practice of the present invention and the laminate 10, i.e., the thermotropic liquid crystal polymer film 21 bonded to the support member 4, can be used in practice. By way of example, where the support member 4 is prepared from a copper foil, the laminate 10 is of a structure made up of the thermotropic liquid crystal polymer film and the copper foil and can be used as an electric circuit substrate or board.

Also, the thermotropic liquid crystal polymer film 21 after the heat treatment may be heat treated again by the post-heating unit 8 at a temperature within the range from 200° to a temperature (Td−20° C.) lower by 20° C. than the heat distortion temperature Td° C. of the film, that is, the temperature at which the film is thermally distored. This is because when the heat treatment has been carried out by the use of the heating unit 6 as hereinabove described, internal strains may reside in the film due to the difference in thermal expansion coefficient between the thermotropic liquid crystal polymer film 2 and the support member 4. The re-heating, or post-heating, of the thermotropic liquid crystal polymer film 21 after the heat treatment within the specified temperature range is effective to relieve the internal strains from the film without altering the increased thermal expansion coefficient of the film. For the post-heating unit 8 for this purpose, any known apparatus such as, for example, a dry oven, a hot roll assembly or a ceramic heater can be conveniently utilized.

Determination of whether the internal strains have been relieved from the thermotropic liquid crystal polymer film as a result of the post-heat treatment discussed above can be performed with reference to the dimensional change before and after the film is heated for 30 minutes at 150° C. Specifically, if the dimensional change is found to be not larger than 0.05%, it can be determined that the internal strains have been relieved from the thermotropic liquid crystal polymer film.

The thermotropic liquid crystal polymer film 21 manufactured in accordance with the present invention preferably has a segment orientation ratio (SOR) not greater than 1.3. The thermotropic liquid crystal polymer film of the present invention has balanced physical and thermal properties in both of the MD and TD directions and, therefore, has a high utility in applications, for example, printed circuit boards and multi-layered printed circuit boards, where the dimensional stability is of prime importance. In particular, where the thermotropic liquid crystal polymer film of the present invention is used in making precision printed circuit boards or precision multilayered printed circuit boards, which requires substantial elimination of warping during the heating, the SOR of the thermotropic liquid crystal polymer film should be not greater than 1.03.

The term "segment orientation ratio (SOR)" referred to above and hereinafter is an index descriptive of the degree of orientation of molecules and represents, unlike the standard MOR (molecular orientation ratio), a value in which the thickness of an object is taken into consideration. This SOR is calculated by the following manner.

Using a commercially available microwave molecular orientation degree measuring apparatus, in which the liquid crystal polymer film is inserted into a microwave resonance waveguide with its film surface laid perpendicular to the direction of propagation of the microwaves, the intensity (i.e., the microwave permeability) of the electric field of microwaves transmitted through such liquid crystal polymer film is measured.

Then, based on the resultant measurement, the m value (hereinafter referred to as a "refractive index") is calculated from the following equation:

$$m=(Zo/\Delta_z)\times[1-v_{max}/v_o]$$

wherin $Zo$ represents a device constant, $\Delta_z$ represents an average thickness of an object subjected to the measurement, $v_{max}$ represents the frequency at which the maximum microwave permeability can be obtained when the frequency of the microwave is varied, and $v_o$ represents the frequency at which the maximum microwave permeability can be obtained when the average thickness is zero, that is, when no object is present.

After the determination of the refractive index m, the segment orientation ration, SOR, can be calculated from the following equation:

$$SOR=m_o/m_{90}$$

wherein $m_o$ represents the value of the refractive index m which is exhibited when the angle of rotation of the object relative to the direction of oscillation of the microwaves is 0°, that is, when the direction of oscillation of the microwaves is aligned with the direction in which molecules of the object are most oriented and in which the minimum microwave penetration strength is exhibited, and $m_{90}$ represents the value of the refractive index m which is exhibited when the angle of rotation of the object is 90°.

It is to be noted that in the illustrated embodiment, arrangement may be made such that after two lengths of thermotropic liquid crystal polymer films 2 have been jointed to the support member 4, followed by the heat treatment in the heating unit 6, the thermotropic liquid crystal polymer films 2 and the support member 4 are then separated from each other.

Hereinafter, the present invention will be demonstrated by way of specific examples which are not intended to limit the scope of the present invention, but are shown only for the purpose of illustration.

It is to be noted that in all of those specific examples, physical parameters of each of the thermotropic liquid crystal polymer film, including the melting point, heat distortion temperature, thermal expansion coefficient, film thickness and dimensional change were measured and evaluated in the following manner.

(1) Melting Point:

Using a differential scanning calorimeter, a sample of the film was heated, with the heating temperature boosted at a rate of 20° C. per minute, to completely melt, the resultant melt being subsequently rapidly cooled down to 50° C. at a rate of 50° C. per minute. The sample so cooled was again heated at a rate of 20° C. per minute, and the melting point of such film was taken from the heat absorption peak appearing during the re-heating of the sample.

(2) Heat Distortion Temperature:

The heat distortion temperature of the film is represented by a temperature, measured by the use of a commercially available thermomechanical analyzer (TMA), at which a sample of the film, 5 mm in width and 20 mm in length, and applied at its opposite ends with a tensile load of 1 g exhibited an abrupt expansion (elongation) when the film sample had been heated at a rate of 5° C./min. from a room temperature to a temperature of breakage thereof. The temperature at the point of intersection between the line tangential to the baseline on a high temperature side and the line tangential to the baseline on a low temperature side in the temperature versus distortion curve was taken as a heat distortion temperature Td.

(3) Thermal Expansion Coefficient:

Using a commercially available thermomechanical analyzer (TMA), a sample of the film, 5 mm in width and 20 mm in length, was, while applied at its opposite ends with a tensile load of 1 g, heated at a rate of 5° C./min. from a room temperature to 200° C., then cooled down to 30° C. at a rate of 20° C./min. and again heated at a rate of 5° C./min. The thermal expansion coefficient was calculated based on the change length of the sample film between the length exhibited when the film sample heated was cooled down to 30° C. and the length exhibited when the same film sample was heated to 150° C.

(4) Uniformity of Thermal Expansion Coefficients:

A sample of the film so obtained was cut at three locations at intervals of 10 cm in its longitudinal direction and also at three locations in its widthwise direction to provide 9 test pieces of the film. Respective thermal expansion coefficients of those 9 test pieces were measured each in a manner similar to that described under the previous paragraph (3). The uniformity is represented by the difference between the maximum and minimum value of the thermal expansion coefficients measured of those test pieces.

(5) Film Thickness:

Using a digital thickness meter (available from Mitsutoyo Co., Ltd., of Japan), A sample of the film was measured at intervals of 1 cm in the TD direction, and the film thickness is represented by the average value of arbitrarily chosen 10 film thicknesses selected from a center portion and end portions.

(6) Dimensional Change:

A sample of the film so obtained was cut at three locations at intervals of 10 cm in its longitudinal direction and also at three locations in its widthwise direction to provide 9 test pieces of the film. Based on IPC-TM-650.2.2.4, those 9 test pieces were allowed to stand at 150° C. for 30 minutes within a dry oven of a hot air circulating type and were thereafter removed out of the dry oven. The rates of change in dimension of those test pieces before and after they were heated within the dry oven were measured in terms of percentage, the average value of which was taken as the dimensional change of the film.

REFERENCE EXAMPLE

A thermotropic liquid crystal polymer, which is a copolymer of p-hydroxybenzoic acid and 6-hydroxy-2-naphthoic acid and which has a melting point of 280° C., was extruded in a melt phase at a rate of 20 Kg per hour and was inflation molded under a inflation molding condition, in which the blow ratio in transverse direction and the draft ratio in longitudinal direction were chosen to be 4.77 and 2.09, respectively, to thereby provide a thermotropic liquid crystal polymer film of 50 μm in film thickness.

The film obtained had a melting point Tm of 280° C., a thermal expansion coefficient of $-10 \times 10^{-6}$ cm/cm/° C. and a heat distortion temperature of 260° C.

EXAMPLE 1

The thermotropic liquid crystal polymer film, obtained under Reference EXAMPLE above, and a support member, which is an aluminum foil of 50 μm in thickness and having a thermal expansion coefficient S of $23 \times 10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 26°° C. under a pressure of 10 Kg/cm² to thereby provide the laminate of the thermotropic liquid crystal polymer film and the copper foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10 \times 10^{-6}$ cm/cm/° C.

The laminate was subsequently passed continuously at a rate of 5 m/min. (for 18 seconds) through the heat treatment oven of a hot air circulating type, 1.5 m in furnace length and controlled to a temperature (Tm–4° C.) of 276° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was increased to $18 \times 10^{-6}$ cm/cm/° C., the heat distortion temperature Td thereof was 260° C. and the dimensional change thereof when heated for 30 minutes at 150° C. was +0.15%.

When the thermotropic liquid crystal polymer film so obtained was heat treated within the heat treatment oven of a hot air circulating type, 1 m in oven length and controlled to a temperature (Td–30° C.) of 230° C., by passing it through the above oven so as to travel at a rate of 2 m/min., the thermotropic liquid crystal polymer film heated for 30 minutes at 150° C. has shown the dimensional change which was found to be +0.01%. It is, however, to be noted that when the thermotropic liquid crystal polymer film was heat treated at 230° C., the thermal expansion coefficient thereof did not change and remained $18 \times 10^{-6}$ cm/cm/° C. and the uniformity of the thermal expansion coefficients was $2 \times 10^{-6}$ cm/cm/° C., which was acceptable.

EXAMPLE 2

The thermotropic liquid crystal polymer film, obtained under Reference EXAMPLE above, and a support member, which is a titanium foil of 30 μm in thickness and having a thermal expansion coefficient S of $9 \times 10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the titanium foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10 \times 10^{-6}$ cm/cm/° C.

The laminate was subsequently passed continuously at a rate of 5 m/min. (for 18 seconds) through the heat treatment oven of a hot air circulating type, 1.5 m in furnace length and controlled to a temperature (Tm–10° C.) of 270° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was increased to $10 \times 10^{-6}$ cm/cm/° C., the heat distortion temperature Td thereof was 260° C. and the dimensional change thereof when heated for 30 minutes at 150° C. was −0.03%.

When the thermotropic liquid crystal polymer film so obtained was heat treated within the heat treatment oven of a hot air circulating type, 1 m in oven length and controlled to a temperature of 230° C., by passing it through the above oven so as to travel at a rate of 2 m/min., the thermotropic liquid crystal polymer film heated for 30 minutes at 150° C. has shown the dimensional change which was found to be −0.01%. It is, however, to be noted that when the thermotropic liquid crystal polymer film was heat treated at 230° C., the thermal expansion coefficient thereof did not change and remained $10 \times 10^{-6}$ cm/cm/° C. and the uniformity of the thermal expansion coefficients was $2 \times 10^{-6}$ cm/cm/° C., which was acceptable.

EXAMPLE 3

The thermotropic liquid crystal polymer film, obtained under Reference EXAMPLE above, and a support member, which is a copper foil of 18 μm in thickness and having a thermal expansion coefficient S of $18 \times 10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the copper foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10 \times 10^{-6}$ cm/cm/° C.

The laminate was subsequently passed continuously at a rate of 5 m/min. (for 18 seconds) through the heat treatment oven of a hot air circulating type, 1.5 m in oven length and controlled to a temperature (Tm−2° C.) of 278° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was increased to $15 \times 10^{-6}$ cm/cm/° C., the heat distortion temperature Td thereof was 260° C. and the dimensional change thereof when heated for 30 minutes at 150° C. was +0.05%.

When the thermotropic liquid crystal polymer film so obtained was heat treated within the heat treatment oven of a hot air circulating type, 1 m in oven length and controlled to a temperature of 230° C., by passing it through the above oven so as to travel at a rate of 2 m/min., the thermotropic liquid crystal polymer film heated for 30 minutes at 150° C. has shown the dimensional change which was found to be +0.01%. It is, however, to be noted that when the thermotropic liquid crystal polymer film was heat treated at 230° C., the thermal expansion coefficient thereof did not change and remained $15 \times 10^{-6}$ cm/cm/° C. and the uniformity of the thermal expansion coefficients was $2 \times 10^{-6}$ cm/cm/° C., which was acceptable.

COMPARATIVE EXAMPLE 1

The thermotropic liquid crystal polymer film, obtained under Reference EXAMPLE above, and a support member, which is a titanium foil of 30 μm in thickness and having a thermal expansion coefficient S of $9 \times 10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metallic heating roll, respectively, they were press-bonded together at 260° C. under a pressure of 10 Kg/cm² to thereby provide the laminate of the thermotropic liquid crystal polymer film and the titanium foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10 \times 10^{-6}$ cm/cm/° C.

The laminate was subsequently passed continuously at a rate of 5 m/min. (for 18 seconds) through the heat treatment oven of a hot air circulating type, 1.5 m in oven length and controlled to a temperature (Tm+15° C.) of 295° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was increased to $30 \times 10^{-6}$ cm/cm/° C., the heat distortion temperature Td thereof was 260° C. and the dimensional change thereof when heated for 30 minutes at 150° C. was −0.40%. In this Comparative Example, since the heating temperature in the heat treatment oven of a hot air circulating type was 295° C., which was higher than the melting point of the thermotropic liquid crystal polymer film and, hence, departed from the temperature range specified in accordance with the present invention and, the resultant thermal expansion coefficient was too greater than necessary and, at the same time, the dimensional change was also considerable.

When the thermotropic liquid crystal polymer film so obtained was heat treated within the heat treatment oven of a hot air circulating type, 1 m in furnace length and controlled to a temperature of 230° C., by passing it through the above oven so as to travel at a rate of 2 m/min., the thermotropic liquid crystal polymer film heated for 30 minutes at 150° C. has shown the dimensional change which changed to be −0.01%. It is, however, to be noted that when the thermotropic liquid crystal polymer film was heat treated at 230° C., the thermal expansion coefficient thereof did not change and remained $30 \times 10^{-6}$ cm/cm/° C., which is too great, and the uniformity of the thermal expansion coefficients was $6\times10^{-6}$ cm/cm/° C., which was unacceptable.

COMPARATIVE EXAMPLE 2

The thermotropic liquid crystal polymer film, obtained under Reference EXAMPLE above, and a support member, which is an aluminum foil of 50 μm in thickness and having a thermal expansion coefficient S of $23\times10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the aluminum foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10\times10^{-6}$ cm/cm/° C.

The laminate was subsequently passed continuously at a rate of 5 m/min. (for 18 seconds) through the heat treatment oven of a hot air circulating type, 1.5 m in oven length and controlled to a temperature (Tm+15° C.) of 295° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was $35\times10^{-6}$ cm/cm/° C., the heat distortion temperature Td thereof was 260° C. and the dimensional change thereof when heated for 30 minutes at 150° C. was −0.30%. Even in this Comparative Example, since the heating temperature in the heat treatment oven of a hot air circulating type was 295° C., which was higher than the melting point of the thermotropic liquid crystal polymer film and, hence, departed from the temperature range specified in accordance with the present invention and, the resultant thermal expansion coefficient was too greater than necessary and, at the same time, the dimensional change was also considerable.

When the thermotropic liquid crystal polymer film so obtained was heat treated within the heat treatment oven of a hot air circulating type, 1 m in oven length and controlled to a temperature of 230° C., by passing it through the above oven so as to travel at a rate of 2 m/min., the thermotropic liquid crystal polymer film heated for 30 minutes at 150° C. has shown the dimensional change which was found to be −0.01%. It is, however, to be noted that when the thermotropic liquid crystal polymer film was heat treated at 230° C., the thermal expansion coefficient thereof did not change and remained $30\times10^{-6}$ cm/cm/° C., and the uniformity of the thermal expansion coefficients was $6\times10^{-6}$ cm/cm/° C., which was unacceptable.

COMPARATIVE EXAMPLE 3

The thermotropic liquid crystal polymer film, obtained under Reference EXAMPLE above, and a support member, which is a aluminum foil of 50 μm in thickness and having a thermal expansion coefficient S of $23\times10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the aluminum foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10\times10^{-6}$ cm/cm/° C.

The laminate was subsequently passed continuously at a rate of 5 m/min. (for 18 seconds) through the heat treatment oven of a hot air circulating type, 1.5 m in oven length and controlled to a temperature (Tm−25° C.) of 255° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film remained $-10\times10^{-6}$ cm/cm/° C., and no improvement in thermal expansion coefficient was found.

COMPARATIVE EXAMPLE 4

The thermotropic liquid crystal polymer film, obtained under Reference EXAMPLE above, and a support member, which is a aluminum foil of 50 μm in thickness and having a thermal expansion coefficient S of $23\times10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the aluminum foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10\times10^{-6}$ cm/cm/° C.

The laminate was subsequently passed continuously at a rate of 9 m/min. (for 10 seconds) through the heat treatment oven of a hot air circulating type, 1.5 m in oven length and controlled to a temperature (Tm+20° C.) of 300° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film was increased to $18\times10^{-6}$ cm/cm/° C. and the uniformity of the thermal expansion coefficients thereof was $8\times10^{-6}$ cm/cm/° C.

While the thermal expansion coefficient of the thermotropic liquid crystal polymer film in this Comparative Example is satisfactory, the uniformity of the thermal expansion coefficients thereof has been found unacceptable.

COMPARATIVE EXAMPLE 5

The thermotropic liquid crystal polymer film, obtained under Reference EXAMPLE above, and a support member, which is an aluminum foil of 50 μm in thickness and having a thermal expansion coefficient S of $23\times10^{-6}$ cm/cm/° C., were supplied towards a continuous hot roll press apparatus including a heat resistant rubber roll, (having a hardness of 90 degree according to the JIS A) and a metal roll. As the thermotropic liquid crystal polymer film and the support member were passed through the nipping area of the continuous hot roll press with the thermotropic liquid crystal polymer film and the support member held in contact the heat resistant rubber roll and the metal roll, respectively, they were press-bonded together at 260° C. under a pressure of 10 Kg/cm² to thereby provide the laminate of the thermotropic liquid crystal polymer film and the aluminum foil at a rate of 3 m/min. At this time, a tensile force of 3 Kg/40 cm width had been applied to the thermotropic liquid crystal polymer film. Using a cut of the laminate so obtained, the thermotropic liquid crystal polymer film and the support member were separated from each other, followed by measurement of the thermal expansion coefficient of the thermotropic liquid crystal polymer film which showed $-10\times10^{-6}$ cm/cm/° C.

The laminate was subsequently passed continuously at a rate of 9 m/min. (for 10 seconds) through the heat treatment oven of a hot air circulating type, 1.5 m in oven length and controlled to a temperature (Tm−20° C.) of 260° C., followed by separation of the thermotropic liquid crystal polymer film from the support member so as to travel in a direction 180° counter to the direction of travel of the support member to complete the continuous production of the heat-treated thermotropic liquid crystal polymer film. It has been found that the thermal expansion coefficient CTEf of the heat-treated thermotropic liquid crystal polymer film did not change and remained $-10\times10^{-6}$ cm/cm/° C. with no improvement made in the thermal expansion coefficient thereof.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

This application is based on Japanese Patent Application No. 2003-341478, filed Sep. 30, 2003, the entire contents of which are here by incorporated by reference.

What is claimed is:

1. A method of making a thermotropic liquid crystal polymer film, which comprises:
    continuously heat treating an extruded thermotropic liquid crystal polymer film joined to a sheet-like support member; and
    subsequently separating the heat-treated thermotropic liquid crystal polymer film from the support member;
    wherein the continuous heat treatment of the thermotropic liquid crystal polymer film joined to the support member is carried out for a heating time of 5 to 60 seconds at a heating temperature T° C. equal to or higher than the melting point Tm° C. of the thermotropic liquid crystal polymer film less 15° C. (i.e., Tm−15° C.), but lower than the melting point Tm° C. (thus, Tm−15° C.≦T° C.<Tm° C.), to thereby increase the thermal expansion coefficient of the thermotropic liquid crystal polymer film,
    wherein the melting point Tm° C. is the melting point of the extruded thermotropic liquid crystal polymer film before the heat treating, and
    wherein the entire heat treating is carried out at a temperature lower than Tm° C.

2. The method of making the thermotropic liquid crystal polymer film as claimed in claim 1, wherein the support member is a sheet-like member having a thermal expansion coefficient greater than that of the thermotropic liquid crystal polymer film.

3. The method of making the thermotropic liquid crystal polymer film as claimed in claim 1, wherein the thermotropic liquid crystal polymer film after the heat treatment and the support member have their thermal expansion coefficients CTEf and S, respectively, which satisfy such a relation as shown by the following formula;

$$-30\times10^{-6}\leq CTEf-S\leq 10\times10^{-6}(\text{cm/cm/° C.}).$$

4. The method of making the thermotropic liquid crystal polymer film as claimed in claim 3, wherein the thermotropic liquid crystal polymer film after the heat treatment and the support member have their thermal expansion coefficients CTEf and S, respectively, which satisfy such a relation as shown by the following formula;

$$-20\times10^{-6}\leq CTEf-S\leq 5\times10^{-6}(\text{cm/cm/°C.}).$$

5. The method of making the thermotropic liquid crystal polymer film as claimed in claim 1, wherein the thermal expansion coefficient CTEf of the thermotropic liquid crystal polymer film after the heat treatment is within the range of $0\times10^{-6}$ to $30\times10^{-6}$ cm/cm/° C.

6. The method of making the thermotropic liquid crystal polymer film as claimed in claim 1, further comprising adjusting a dimensional change by post-heating the thermotropic liquid crystal polymer film, which has been separated from the support member, at a post-heating temperature within the range from 200° to a temperature (Td−20° C.) lower by 20° C. than a heat distortion temperature Td° C. of the film at which the film is thermally distorted.

7. The method of making the thermotropic liquid crystal polymer film as claimed in claim 1, wherein the heating temperature is equal to higher than the melting point Tm° C. less 10° C., but lower than the melting point Tm° C. of the film.

8. The method of making the thermotropic liquid crystal polymer film as claimed in claim 1, wherein the heating time is 10 to 30 seconds.

9. The method of making the thermotropic liquid crystal polymer film as claimed in claim 1, wherein the continuous heat treatment of the thermotropic liquid crystal polymer film joined to the support member is carried out for a heating time of 10 to 30 seconds at a heating temperature T° C. equal to or higher than the melting point Tm° C. of the thermotropic liquid crystal polymer film less 10° C. (i.e., Tm−10° C.), but lower than the melting point Tm° C. (thus, Tm−10° C.≦T° C.<Tm° C.).

10. The method of making the thermotropic liquid crystal polymer film as claimed in claim 1, wherein the continuous heat treatment of the thermotropic liquid crystal polymer film joined to the support member is carried out for a heating time of 5 to 60 seconds at a heating temperature T° C equal to or higher than the melting point Tm° C. of the thermotropic liquid crystal polymer film less 6° C. (i.e., Tm−6° C.), but lower than the melting point Tm° C. (thus, Tm−6° C.≦T° C.<Tm° C.).

11. The method of making the thermotropic liquid crystal polymer film as claimed in claim 1, wherein the support member has a coefficient of thermal expansion higher than that of the thermotropic liquid crystal polymer film before the thermotropic liquid crystal polymer film is heat treated.

12. The method of making the thermotropic liquid crystal polymer film as claimed in claim 1, wherein the support member is made of aluminum, copper, stainless steel, polytetrafluoroethylene, titan, iron, chromium steel or nickel.

13. The method of making the thermotropic liquid crystal polymer film as claimed in claim 1, wherein the support member is made of aluminum stainless steel, titan or nickel.

14. The method of making the thermotropic liquid crystal polymer film as claimed in claim 1, wherein the thickness of the thermotropic liquid crystal polymer film is 20 to 150 μm and the support member has a thickness of 7 to 200 μm.

15. The method of making the thermotropic liquid crystal polymer film as claimed in claim 1, wherein the thickness of the thermotropic liquid crystal polymer film is 20 to 50 μm and the support member has a thickness of 7 to 75 μm.

16. The method of making the thermotropic liquid crystal polymer film as claimed in claim 1, wherein an atmosphere under which the heat treatment is carried out is filled with an inert gas.

17. The method of making the thermotropic liquid crystal polymer film as claimed in claim 1, wherein an atmosphere under which the heat treatment is carried out comprises oxygen in a quantity not greater than 1.0 vol. %.

18. The method of making the thermotropic liquid crystal polymer film as claimed in claim 1, wherein the thermotropic liquid crystal polymer film, after being heat treated and separated from said support member, has a segment orientation ratio (SOR) not greater than 1.3.

19. The method of making the thermotropic liquid crystal polymer film as claimed in claim 1, wherein the thermotropic liquid crystal polymer film, after being heat treated and separated from said support member, has a segment orientation ratio (SOR) not greater than 1.03.

20. The method of making the thermotropic liquid crystal polymer film as claimed in claim 1, wherein:

the continuous heat treatment of the thermotropic liquid crystal polymer film joined to the support member is carried out for a heating time of 10 to 30 seconds at a heating temperature T° C. equal to or higher than the melting point Tm° C. of the thermotropic liquid crystal polymer film less 10° C. (i.e., Tm−10° C.), but lower than the melting point Tm° C (thus, Tm−10° C.≦T° C.<Tm° C.);

the support member has a coefficient of thermal expansion higher than that of the thermotropic liquid crystal polymer film before the thermotropic liquid crystal polymer film is heat treated;

the support member has a thickness of 7 to 200 μm;

an atmosphere under which the heat treatment is carried out comprises oxygen in a quantity not greater than 1.0 vol. %; and the thermotropic liquid crystal polymer film, after being heat treated and separated from said support member, has a segment orientation ratio (SOR) not greater than 1.03.

21. The method of making the thermotropic liquid crystal polymer film as claimed in claim 1, wherein the continuous heat treatment of the thermotropic liquid crystal polymer film and the support member is carried out with a hot press roll assembly driven at a speed of 0.1 m/mm. to 10 m/min, as calculated in terms of linear velocity of the periphery thereof.

* * * * *